(12) United States Patent
Hosoe et al.

(10) Patent No.: US 8,019,952 B2
(45) Date of Patent: Sep. 13, 2011

(54) STORAGE DEVICE FOR STORING DATA WHILE COMPRESSING SAME VALUE INPUT DATA

(75) Inventors: Koji Hosoe, Kawasaki (JP); Masaaki Nagatsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 430 days.

(21) Appl. No.: 11/032,156

(22) Filed: Jan. 11, 2005

(65) Prior Publication Data

US 2005/0111292 A1    May 26, 2005

Related U.S. Application Data

(63) Continuation of application No. PCT/JP02/12526, filed on Nov. 29, 2002.

(51) Int. Cl.
G06F 12/00 (2006.01)
G06F 13/00 (2006.01)

(52) U.S. Cl. ........ 711/156; 711/100; 711/154; 711/170; 711/200

(58) Field of Classification Search ................ 711/156, 711/100, 154, 170, 200
See application file for complete search history.

(56) References Cited

U.S. PATENT DOCUMENTS

| | | | | |
|---|---|---|---|---|
| 4,873,667 A | * | 10/1989 | Geadah et al. | 365/189.07 |
| 5,153,591 A | * | 10/1992 | Clark | 341/51 |
| 5,388,074 A | * | 2/1995 | Buckenmaier | 365/189.05 |
| 5,491,659 A | * | 2/1996 | Howarter et al. | 365/219 |
| 5,532,694 A | * | 7/1996 | Mayers et al. | 341/67 |
| 5,594,702 A | * | 1/1997 | Wakeman et al. | 365/230.05 |
| 6,553,448 B1 | * | 4/2003 | Mannion | 711/2 |
| 7,010,645 B2 | * | 3/2006 | Hetzler et al. | 711/113 |
| 7,174,432 B2 | * | 2/2007 | Howard et al. | 711/147 |

FOREIGN PATENT DOCUMENTS

| | | |
|---|---|---|
| JP | 57-187752 | 11/1982 |
| JP | 62-241022 | 10/1987 |
| JP | 1-196652 | 8/1989 |
| JP | 9-274599 | 10/1997 |

OTHER PUBLICATIONS

Japanese Office Action mailed Feb. 19, 2008 in corresponding Japanese Application No. 2004-556773.

* cited by examiner

*Primary Examiner* — Tuan V. Thai
(74) *Attorney, Agent, or Firm* — Staas & Halsey LLP

(57) ABSTRACT

A storage device for storing data, while compressing same value of input data, includes an input processing unit, a data storage, a first-in-first-out memory, and an output processing unit. The input processing unit is configured to, upon receiving an input value, determine whether a data value stored in the data storage at an address location corresponding to the input value is valid. If the data value is invalid, the input processing unit stores an initial value at the address location and stores the input value in the first-in-first-out memory. If the data value is valid, the input processing unit performs an arithmetic operation on the data value and stores the operation result in the address location corresponding to the input value. The output processing unit is configured to read and output the input value stored at a head of the first-in-first-out memory, as well as reading and outputting the data value from the address location of the data storage corresponding to the input value, if one or more input values are stored in the first-in-first-out memory and if the data value stored at the address location of the data storage corresponding to the input value is valid, and to update the data value after the output.

14 Claims, 10 Drawing Sheets

STORAGE DEVICE FOR STORING DATA WHILE COMPRESSING SAME VALUE INPUT DATA

CROSS REFERENCE

This application is a continuation application filed under 35 USC 111(a) claiming benefit under 35 USC 120 and 365 (c) of PCT application JP02/12526, filed Nov. 29, 2002, the entire contents of which are incorporated herein by reference.

BACKGROUND OF THE INVENTION

1. Field of the Invention

The present invention generally relates to a storage device provided to, for example, the input end of a data processing apparatus for processing successively input data sequences, and more particularly, to a storage device configured to store data while compressing data items with the same input value.

2. Description of the Related Art

In data processing apparatuses for processing successively input data sequences, the internal data processing circuit may often require more time than the data supply interval. In order to absorb the difference between the data supply interval (or rate) and the data processing time (or rate), a first-in-first-out (FIFO) memory is generally provided at the input end of the data processing apparatus.

JP 9-274599A discloses a buffer memory aiming at efficient memory use, eliminating the necessity of writing all of the same data successively input to the processing apparatus in the FIFO memory.

Even if a FIFO memory is provided at the input end of the processing apparatus, the FIFO memory itself becomes full when the transmission rate of the input data sequences is greater than the data processing rate of the internal circuit. In this case, the operation of the data supply unit for supplying the data sequences to the data processing apparatus has to be suspended.

In order to prevent the suspension of the data supply unit from further causing other devices to temporarily suspend their operations, a queuing mechanism has to be provided to each of such devices provided on the data supply side. Alternatively, for those devices configured to finish the process when a prescribed time has passed (timeout expiration), it has to be guaranteed that the suspension time does not exceed the timeout period.

Meanwhile, the data sequences input from the data supply unit to the FIFO memory do not necessarily have to be output from the FIFO memory in the same order as the input order, that is, do not have to strictly comply with the transmission order. In addition, multiple data sequences from the data supply unit may be put together, and one data item may be supplied from the FIFO memory to the next-stage processing unit. In such a case, the data item is often in the correct data format for processing in the processing unit.

However, with the conventional techniques, if data are input to the FIFO memory exceeding the memory capacity, the overflow data are discarded, or alternatively, the discarded data are transmitted again to the FIFO memory.

If the overflow time in which the input data cannot be stored in the memory exceeds a prescribed time, or if the number of retransmissions of the discarded data exceeds a prescribed threshold, due to lack of storage space of the FIFO memory, the system may go down, depending on the system design. There is also a load distribution type data processing apparatus with multiple internal processing units provided to process different types of data sequences supplied from the data supply unit. In such an apparatus, if data sequences of the same type are continuously input, the workload cannot be distributed because data processing is carried out based solely on a specific type of data sequence.

SUMMARY OF THE INVENTION

The present invention was conceived to overcome the above-described problems in the prior art, and it is an object of the present invention to provide a storage device that stores data, while compressing data items having the same input value.

To achieve the object, in one aspect of the invention, a storage device for storing data, while compressing data items with the same input value, includes an input processing unit, a data storage, a first-in-first-out memory, and an output processing unit. Upon receiving an input value, the input processing unit determine whether a data value stored in the data storage at an address location corresponding to the input value is valid. If the data value is invalid, the input processing unit stores an initial value at the address location, and stores the input value in the first-in-first-out memory. If the data value is valid, the input processing unit performs an arithmetic operation and stores the operation result in the address location. The output processing unit is configured to read and output the input value stored at a head of the first-in-first-out memory, as well as reading and outputting the data value from the address location of the data storage corresponding to the input value, if one or more input values are stored in the first-in-first-out memory and if the data value stored in the address location of the data storage corresponding to the input value is valid, and update the data value after the output.

Since the above-described storage device is configured so as to store input data, while compressing those data items having the same input value through the arithmetic operation, the input data can be stored reliably in a limited capacity memory space, within a fixed time period.

It becomes unnecessary for those devices arranged on the data sequence supply side to have queuing mechanisms. It is also guaranteed that even if suspension of operations occurs, the suspension period does not exceed the timeout expiration time. In addition, a situation where a certain value of data is continuously output from the compressed FIFO memory 102 can be prevented, and the data values are output from the FIFO memory within a prescribed time. If the storage device is applied to a load distribution type data processing apparatus having multiple processing devices adapted to different types of data items, load distribution can be appropriately implemented because an undesirable situation where input data of the same value (or same type) are solely and continuously output from the FIFO memory can be prevented.

BRIEF DESCRIPTION OF THE DRAWINGS

Other objects, features, and advantages of the present invention will become more apparent from the following detailed description when read in conjunction with the accompanying drawings, in which.

DETAILED DESCRIPTION OF THE PREFERRED EMBODIMENTS

The preferred embodiments of the present invention are now described below with reference to the attached drawings.

Figure 1:
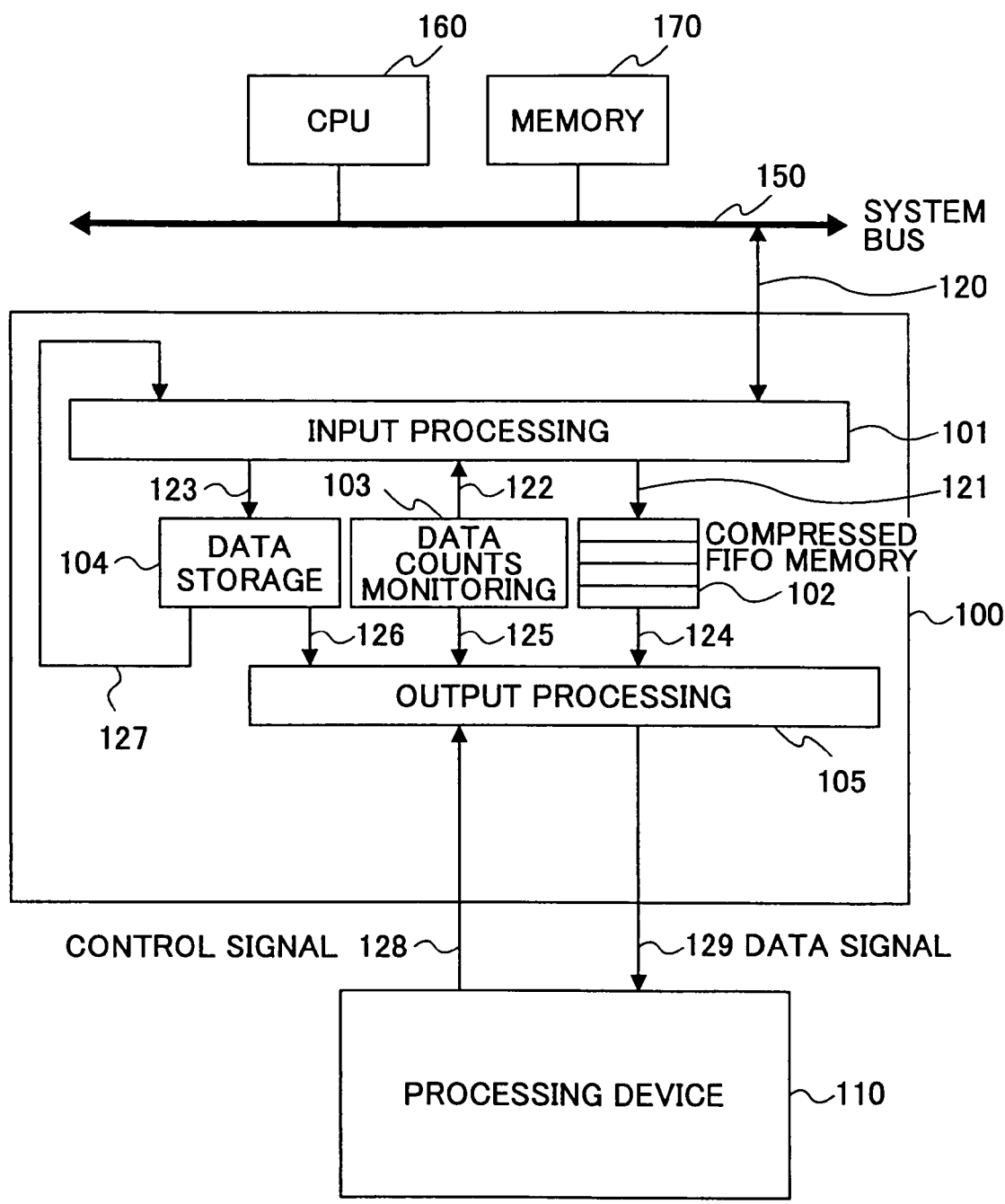
FIG. 1 is a schematic diagram illustrating a system configuration surrounding a storage device configured to store data while compressing data items with the same input value, according to an embodiment of the invention.

FIG. 1 is a schematic diagram illustrating an example of the system configuration surrounding a storage device configured to store data while compressing data items with the same input value.

In the configuration shown in FIG. 1, a storage device 100 is connected to a processing device 110. The storage device 100 is also connected via a system bus 150 to a central processing unit (CPU) 160 and a memory 170. The storage device 100 has an input processing unit 101, a compressed first-in-first-out (FIFO) memory 102, a data counts monitoring unit 103, and an output processing unit 105.

The storage device 100 and the processing device 110 are arranged in, for example, a subsystem card connected to the system bus 150 in a computer. The data stream input from, for example, the CPU 160 via the system bus 150 is stored in the storage device 100. Then, the output data from the storage device 100 are supplied to the processing device 110, in which the data are processed. The data values defining the data stream input to the storage device 100 via the system bus 150 are, for example, address values of the respective components of the processing device 110. The address values represent, for example, commands supplied from the CPU 160 to the respective components of the processing device 110.

The subsystem card connected to the system bus 150 structures a system for processing the commands supplied from the CPU 160 one by one, using a micro controller or other LSI components formed in the processing device 110. The data processing rate is often lower than the command value input rate input to the storage device 100 via the system bus 150.

In operations of the system shown in FIG. 1, the input processing unit 101 determines whether a valid data value is stored in the data storage 104 at an address corresponding to the input value A supplied via the system bus 150. If the data value stored in the address is an invalid value, such as zero, then a prescribed initial value (for example, "1") is written in the data storage 104 at the address corresponding to the input value A. The input processing unit 101 also stores the input value A in the compressed FIFO memory 102. If the data value store in the data storage 104 at the address corresponding to the input value A is a valid value, then, the input processing unit 101 conducts a prescribed operation (for example, incrementing or adding 1 to the stored data value), and writes back the operation result in the address corresponding to the input value A. In this case, the input value A is not stored in the compressed FIFO memory 102. This means that if a certain input value A is stored in the compressed FIFO memory 102, the corresponding address location of the data storage 104 indicates information about how many times the input value A has been input to the storage device 100.

If one or more input values A are stored in the compressed FIFO memory 102, and if the data values stored in the data storage 104 at the addresses corresponding to the input values A are valid, then the output processing unit 105 reads the input value A stored at the head of the compressed FIFO memory 102, and outputs the value as an output address F. At the same time, the output processing unit 105 reads the data value from the data storage 104, stored at the address corresponding to the output address F, and outputs the data value as output data G. Then, the output processing unit 105 writes back an invalid value, such as zero, in that address of the data storage 104.

In this manner, when receiving data items with the same address values in a input data sequence from the data supply unit, the storage device 100 compresses these data items having the same input (address) value through the arithmetic operation. Consequently, input data sequences are stored reliably in a storage device with a limited capacity, within a fixed time, preventing overflow and data discarding.

With this arrangement, it becomes unnecessary to provide queuing mechanisms to devices arranged on the data supply side or to data sequence compressing device. It is also guaranteed that even if suspension of operations occurs, the suspension period does not exceed the timeout expiration time. In addition, a situation where a certain value of data are continuously output from the compressed FIFO memory 102 can be prevented, and the data values are output from the compressed FIFO memory 102 within a prescribed time. This arrangement can be efficiently applied to a load distribution type data processing apparatus having multiple processing devices adapted to different types of data items, because it can prevent the input data of the same value (or same type) from being solely and continuously output from the compressed FIFO memory.

The above-described basic structure can also be applied to data transmission between functional blocks with different operating speeds, such as data transmission between LSI chips, data input via a bus, data input from communication channels, or interconnection between functional modules in an LSI chip.

Next, the first embodiment of the present invention is explained.

Figure 2:
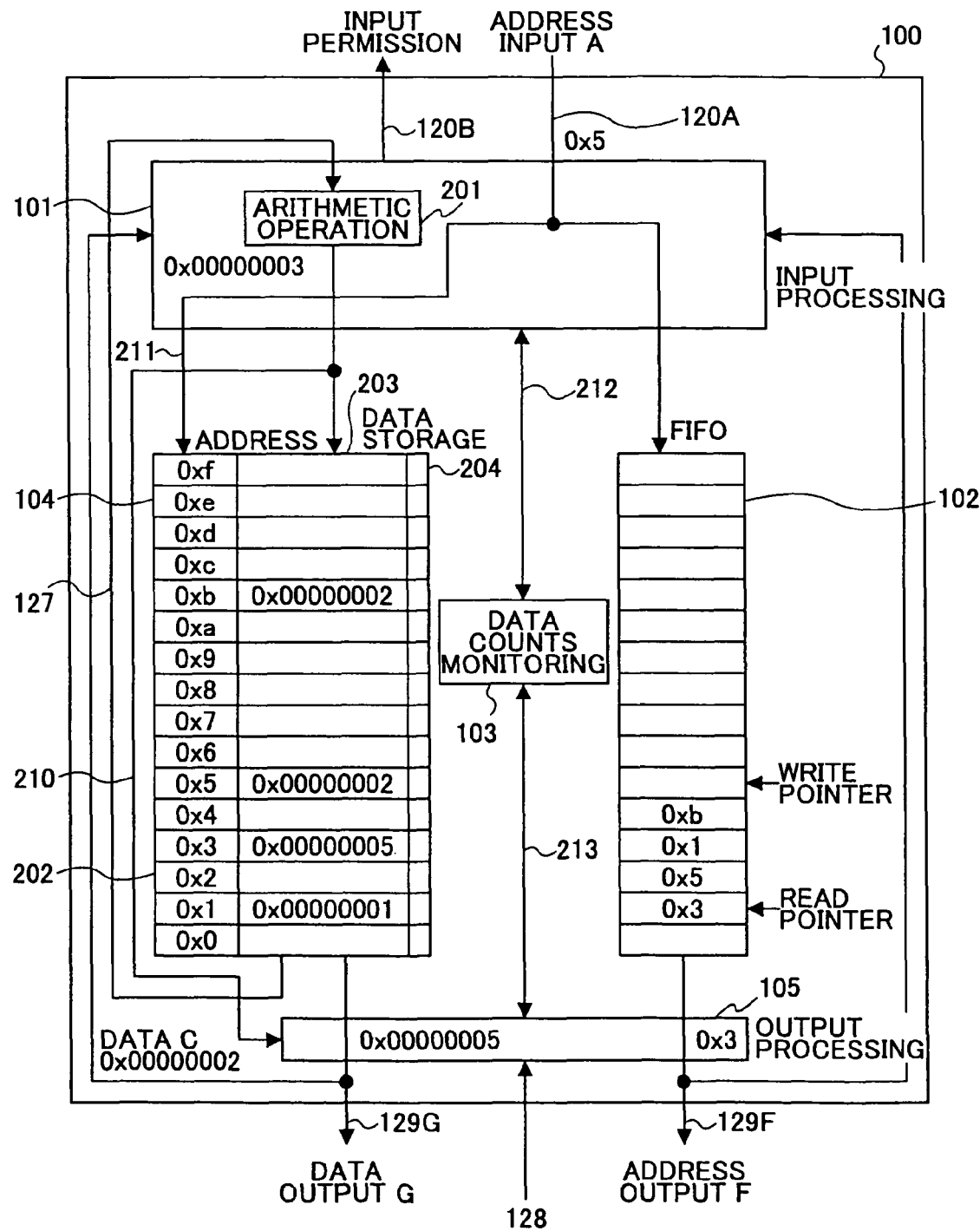
FIG. 2 is a schematic diagram illustrating the structure of the storage device shown in FIG. 1, according to the first embodiment of the invention.

FIG. 2 is a block diagram illustrating the detained structure of the storage device 100, which is configured to store data while compressing data items with the same input value, according to the first embodiment of the invention. The same components as those shown in FIG. 1 are denoted by the same numerical references.

The input processing unit 101 of the storage device 100 has an arithmetic operations unit 201. The data storage 104 has an address region 202, a data region 203, and a flag region 204. When a data item is being stored in the data region 203, a flag indicating validity or invalidity of the data value stored in the data area 203, or a flag indicating error occurrence in the hardware can be set in the flag region 204.

In operations, the input processing unit 101 outputs an input permission 120B to the system bus 105. Then, the address input value A (120A) is input to the storage device 100 via the system bus 150. The input processing unit 101 determines whether a valid data value is stored in the data storage 104 at the address corresponding to the input value A. For example, if the input value A (120A) is "0x5", the input processing unit 101 supplies the value "0x5" to the address region 202 of the data storage 104, and reads the data stored in the data region 203 corresponding to address "0x5" of the address region 202. The data 127 read from the data storage 104 are input to the input processing unit 101. In this example, data C stored at address 0x5 of the data storage 104 is 0x00000002, which value is a valid value indicating that the input processing unit 101 has already received the input value 0x5 twice.

Accordingly, an arithmetic operation is performed on data "0x00000002" stored in the data storage 104 at address 0x5 corresponding to the input address value A (120A). An example of the arithmetic operation is incrementing or adding "1" to the data "0x00000002" stored in the data storage 104. Then, the input processing unit 101 writes back the operation result, that is, a data value "0x00000003", in address 0x5 of the data storage 104. Concerning the input value of address 0x5, the input processing unit 101 does not stores the input value because this input value of address 0x5 already exists in the compressed FIFO memory 102. Determination as to whether the current input value A already exists in the compressed FIFO memory 102 can be made by monitoring the compressed FIFO memory 102.

The output processing unit 105 detects whether one or more input values 120A are stored in the compressed FIFO memory 102. This detection can be made by referring to the data counts monitoring unit 103, which is monitoring data input to the compressed FIFO memory 102, as well as data output from the compressed FIFO memory 102. The presence of the input values in the compressed FIFO memory 102 can also be detected from either the read pointer or the write pointer of the compressed FIFO memory 102 in a simpler manner.

In the example shown in FIG. 2, one or more input values 120A are stored in the compressed FIFO memory 102, and the data items stored at the addresses corresponding to the input values 120A are valid. Consequently, the output processing unit 105 reads the input value 0x3 stored at the head of the compressed FIFO memory 102, and outputs this value as an output address F (or an output value 129F). The output processing unit 105 also reads data item "0x0000005" from the data storage 104 at an address location corresponding to the output value 0x3, and outputs the data item as output data G. Then, the output processing unit 105 writes back an invalid data value "0x00000000" in the data storage 104 at address 0x3 corresponding to the output address F. At this time, a flag indicating the invalidity of data may be set in the flag region 204.

Figure 3:
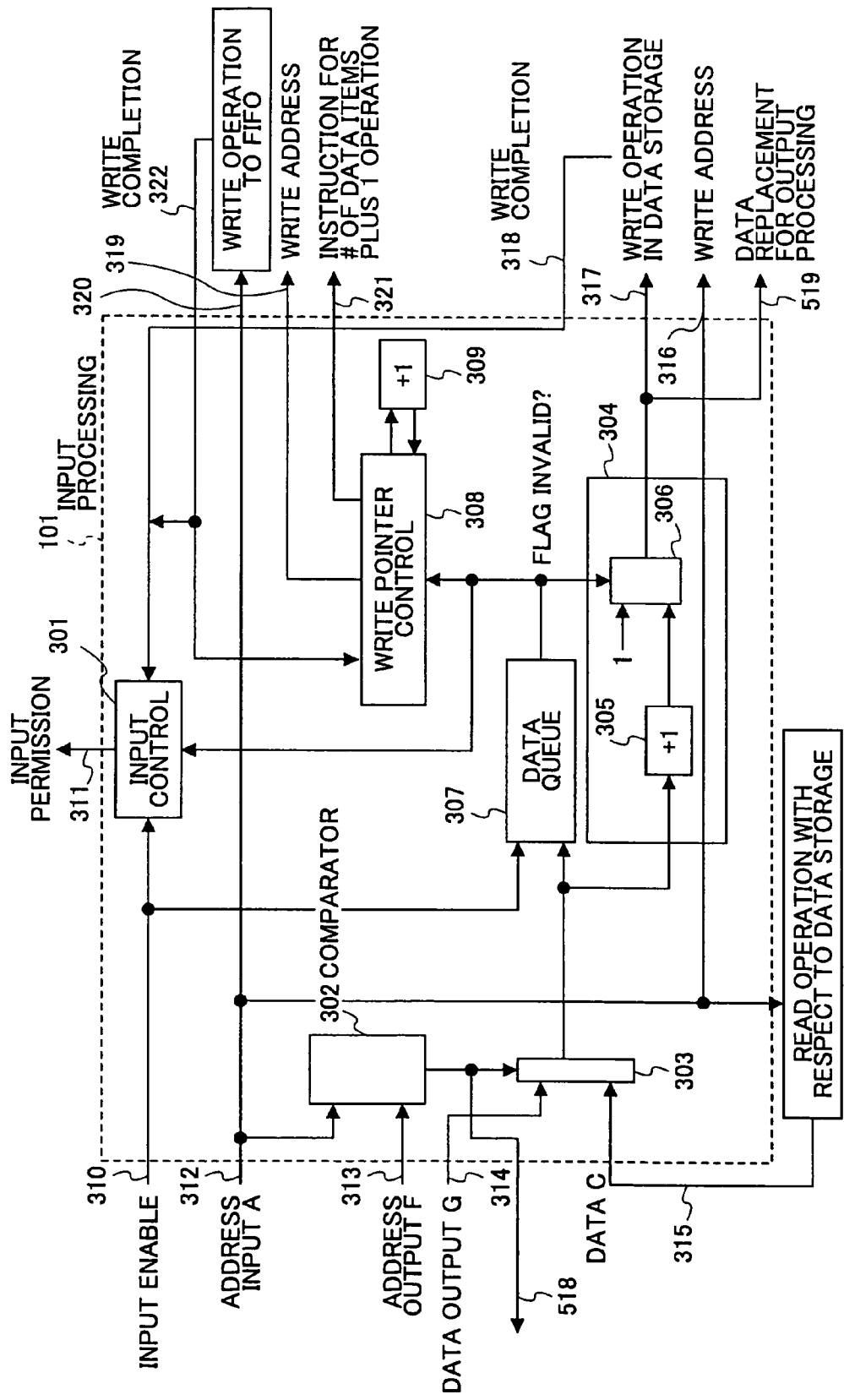
FIG. 3 is a schematic diagram illustrating the detailed structure of the input data processing unit of the storage device shown in FIG. 2, according to the first embodiment of the invention.
Figure 4:
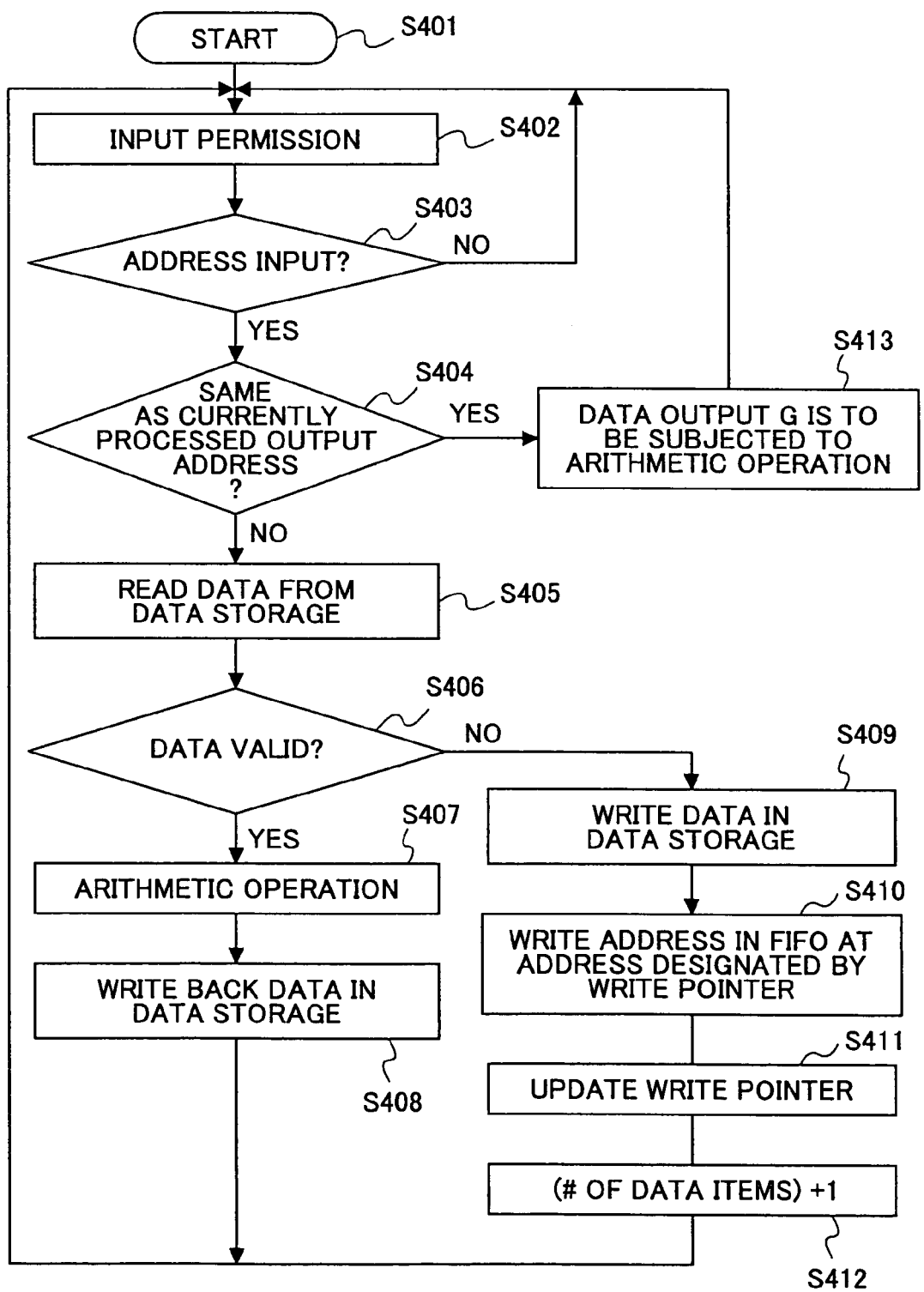
FIG. 4 is a flowchart showing the operation carried out by the input data processing unit shown in FIG. 3, according to the first embodiment of the invention.

Next, a more detailed explanation is made of the input data processing unit 101 of the storage device 100, with reference to FIG. 3 and FIG. 4. FIG. 3 is a block diagram illustrating the detailed structure of the input data processing unit 101, and FIG. 4 is a flowchart showing the operation of the input data processing unit 101.

The input data processing unit 101 shown in FIG. 3 has an input control unit 301, a comparator 302, a selector 303, an arithmetic operations unit 304, a data queue 307, a write pointer control unit 308, and an incrementing unit 309. The arithmetic operations unit 204 has an adder 305 for adding 1 and a selector 306 in this example. The input processing unit carries out operations shown in the flowchart of FIG. 4.

In FIG. 4, first in step S401, the process starts in response to an input enable signal (310) supplied to the input processing unit 101 as shown in FIG. 3.

In step S402, an input permission signal (311) is output from the input processing unit 101 to the system bus 150. Using the input permission signal (311), input to the storage device 100 is controlled. If the storage device 100 is currently accessing the input processing unit 101 or the data storage 104, an input to the storage device 100 is not permitted. For example, in the example shown in FIG. 1 in which the storage device 100 is connected to the system bus 150, if an address input A (312) occurs when the input permission signal (311) is disabled, then a retry request is supplied from the input processing unit 101 via the system bus 150 to the CPU 160. However, if the data input interval is longer than time required for the writing operation in the input processing unit 101 or the data storage 104, the input control using the input permission signal is not required.

Then, in step S403, it is determined whether an address input A (312) has been input to the storage device 100. If there is an address input A (YES in S403, the process proceeds to step S404, and otherwise, the process returns to step S402.

Then, in step S404, the address input A (312) is compared with address output F (313) at the comparator 302 shown in FIG. 3. If the value of the address input A (312) is the same as that of the address output F (313) (YES in S404), the current output data G (314) is to be subjected to the arithmetic operation at the arithmetic operations unit 304, and therefore, the process proceeds to step S413. In step S413, the selector 303 selects the current output data G (314), rather data C. If the address input A does not agree with the current address output F (NO in S404), the process proceeds to step S405, in which data item C (315) is read from the data storage 104 and selected by the selector 303.

Then, in step S406, it is determined by the data queue 307 (see FIG. 3) whether the data item C (315) read from the data storage 104 is valid. For example, if the data item C (315) has a value zero, the data item C is invalid, and otherwise, the data item C is valid. Alternatively, the flag set in the flag region of the data storage 104 may be checked for the determination. In this case, the flag indicating the data validity is read from the data storage 104, together with the data item C (315).

If it is determined in step S406 that the data item C (315) is valid, the process proceeds to step S407, in which the adder 305 of the arithmetic operation unit 304 adds "1" to the output value (data item C) of the selector 303, and the selector 306 selects the addition result. Then, in step S408, the input processing unit 101 supplies the write address (316) and write data (317), which is the addition result, to the data storage 104. As a result, a new data value obtained by adding 1 to the data item C (315) is written back to the data storage 104. Upon receiving a write completion signal (318) from the data storage 104, the input processing unit 101 enables the input permission signal (311), and the process returns to step S402.

On the other hand, if it is determined in step S406 that the data item C (315) is invalid, then the process proceeds to step S409, and the selector 306 of the arithmetic operation unit 304 selects "1" as the initial value. In this case, write address (316) and write data (317) with the initial value "1" are supplied from the input processing unit 101 to the data storage 104 to write a valid data value in the associated address of the data storage 104.

Upon receipt of a write completion signal (318) from the data storage 104, the process proceeds to step S410, in which a write address (319) is generated and address data (320) are written in the compressed FIFO memory 102 at the address designated by the write pointer.

Then, in step S411, the write pointer controller 308 regulates the adder 309 so as to increment the write pointer by 1.

Then, in step S412, the write pointer controller 308 supplies an instruction for incrementing the number of data items held in the compressed FIFO memory to the data counts monitoring unit 103. The data counts monitoring unit 103 stores the incremented number of data items. Finally, upon receiving a write completion signal (322) from the compressed FIFO memory 102, the input permission signal (311) is enabled and the process returns to step S402.

Figure 5:
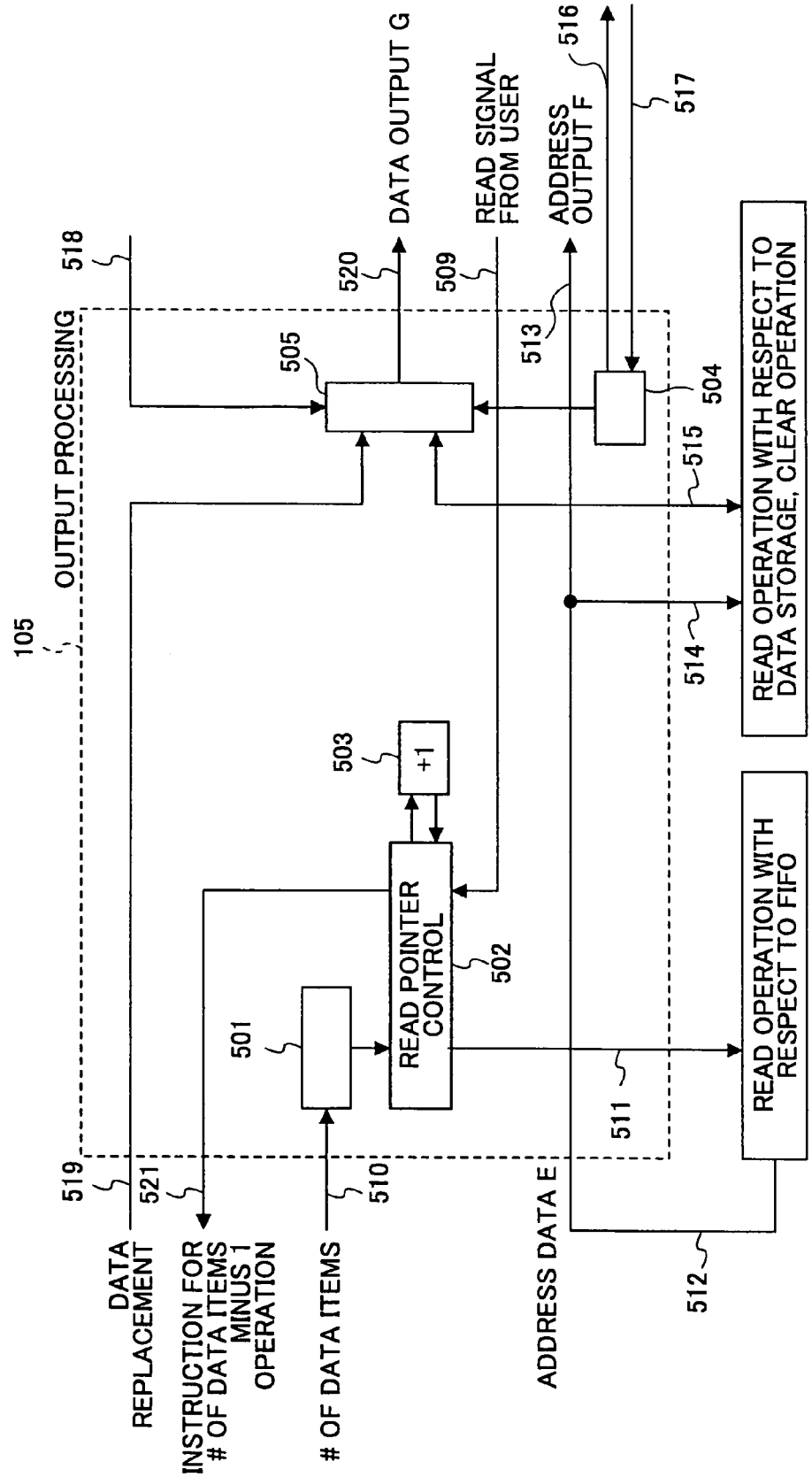
FIG. 5 is a schematic diagram illustrating the detailed structure of the output data processing unit of the storage device shown in FIG. 2.
Figure 6:
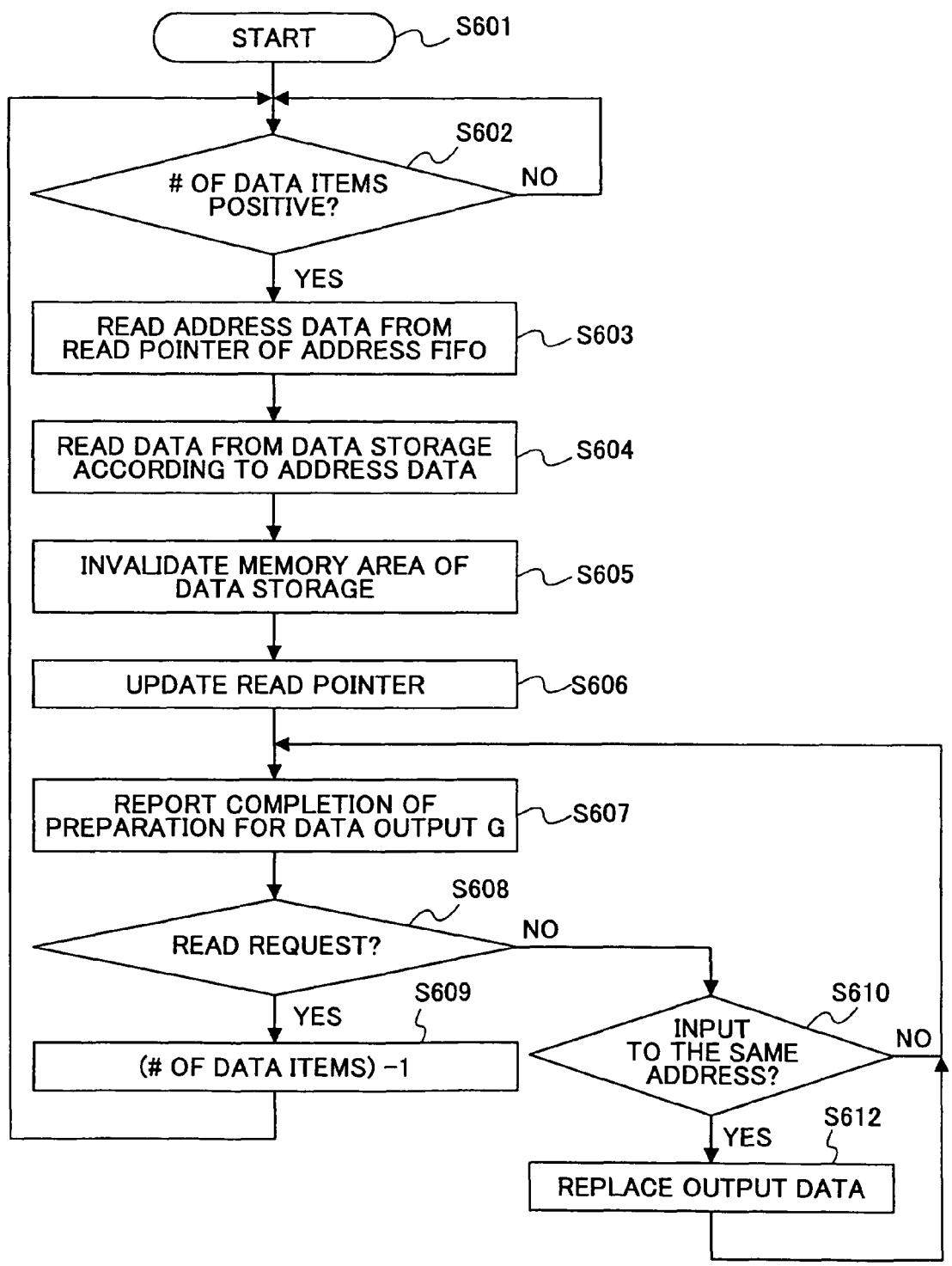
FIG. 6 is a flowchart showing the operation carried out by the output data processing unit shown in FIG. 5, according to the first embodiment of the invention.

Next, explanation is made of the output data processing unit 105 of the storage device 100, with reference to FIG. 5 and FIG. 6, according to the first embodiment of the invention. FIG. 5 is a block diagram illustrating the detailed structure of the output data processing unit 105, and FIG. 6 is a flowchart showing the operation of the output data processing unit 105.

The output processing unit 105 shown in FIG. 5 has a determination block 501 for determining whether the number of data items held in the compressed FIFO memory 102 is positive, a read pointer controller 502, an adder 503 for adding "1", an output data preparation controller 504, and a selector 505. The output processing unit 105 operates as shown in the flowchart of FIG. 6.

In FIG. 6, first in step S601, the process starts in response to a read signal (509) input to the output processing unit 105 from the processing device 110 shown in FIG. 1 through user manipulation.

Then, in step S602, the determination block 501 determines whether the number of data items (510) held in the compressed FIFO memory 102 is positive. This determination is performed based on the information supplied from the data counts monitoring unit 103 (see FIG. 2). If the number of data items (510) registered in the compressed FIFO memory 102 is positive, the process proceeds to step S603. If not, step S602 is repeated until the number of data items (510) becomes positive.

In step S603, the read pointer controller 502 supplies an address signal (511) to the compressed FIFO memory 102, and reads address data E (512) from the FIFO memory 102.

Then, in step S604, the output processing unit 105 outputs the address data E (512) as an address output F (513) to the processing device 110. At the same time, the output processing unit 105 outputs the address data E (512) as a read address output (514) to the data storage 104, and receives data (515) stored at an address designated by the address output (514) from the data storage 104.

Then, in step S605, an invalid value is written in the data storage 104 at an address defined by the read address output (514). At this time, a flag indicating the invalidity of the data value may be set in the flag region 204 of the data storage 104.

Then, in step S606, the read pointer controller 502 causes the adder 503 to increment the read pointer of the compressed FIFO memory 102 by 1.

Then, in step S607, a notice (516) reporting the completion of preparation for data output G is supplied from the output data preparation control unit 504 to the processing device 110 (shown in FIG. 1).

Then, in step S608, the output data preparation control unit 504 determines whether a read request (517) has been output from the processing device 110. If a read request has been output from the processing device 110 (YES in S608), the process proceeds to step S609. If not, the process proceeds to step S610.

In step S609, the selector 505 is regulated so as to select and output the data (515) read from the data storage 104 as a data output G (520) to the processing device 110. Since in step S609 a data item is read from the compressed FIFO memory 102 by the read pointer controller 502, an instruction (512) for decrementing the number of data items is supplied to the data counts monitoring unit 103 shown in FIG. 2.

On the other hand, in step S610, it is determined whether the input processing unit 101 has received an address input A (312) having the same address as the output address F (513) which is currently output to the processing device 110. If the same address input A (312) has not been received yet (NO in S610), the process returns to step S607. If the input address A (312) having the same address as the currently output address F (513) is received (YES in S610), the process proceeds to step S612, in which the selector 505 is switched in response to a comparison signal 518 supplied from the comparator 302 shown in FIG. 3. As a result, the queued data item is selected, and a data item (519) having a value reflecting the input value in the queued data is output as a data output G (520) to the processing device 110. After completion of step S612, the process returns to step S607.

Figure 7:
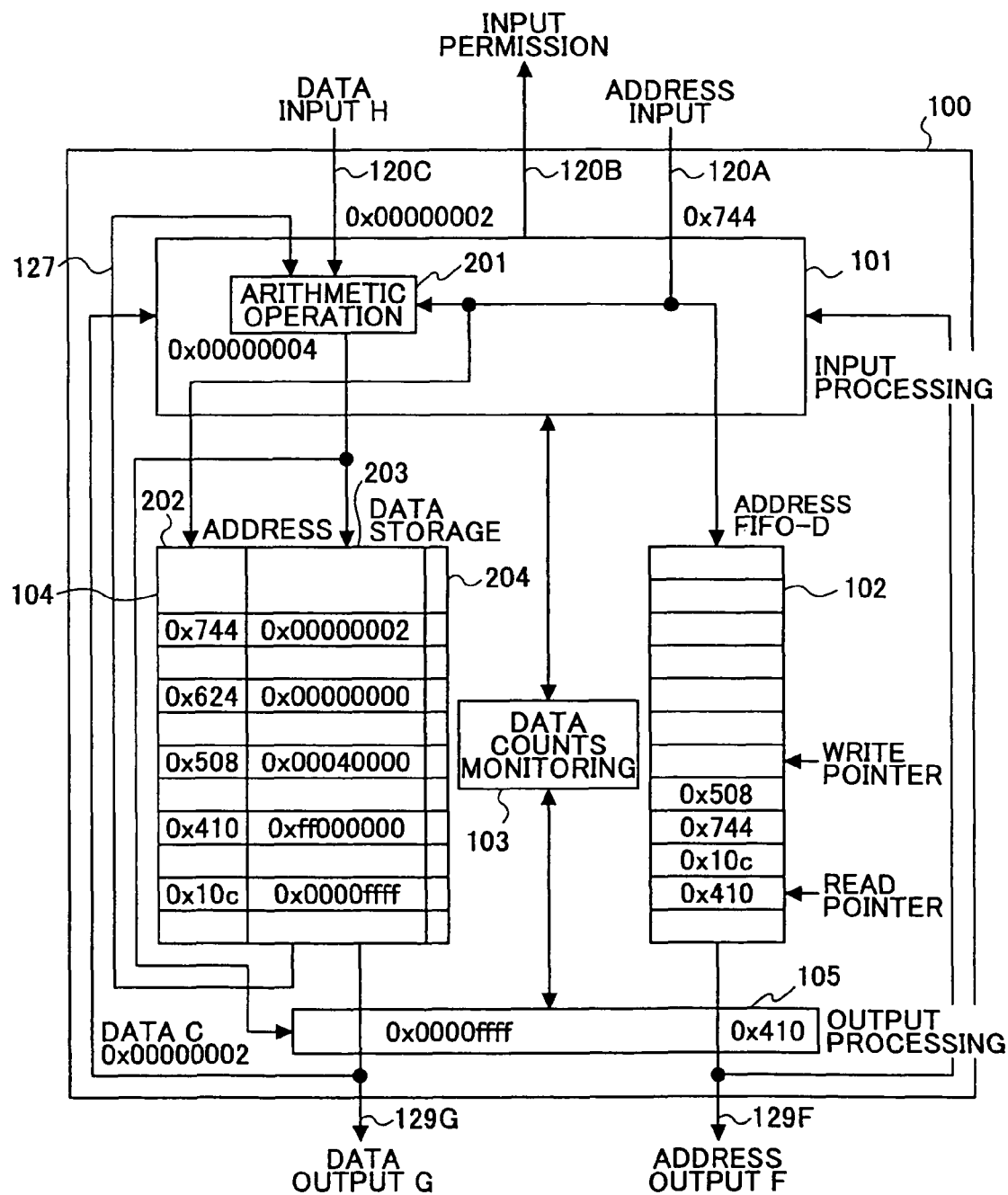
FIG. 7 is a block diagram of the storage device configured to store data while compressing data items having the same input value, according to the second embodiment of the invention.

Next, the second embodiment of the present invention is described. FIG. 7 is a block diagram of a storage device configured to store data while compressing data items with the same input (address) value, according to the second embodiment of the invention. In FIG. 7, the same components as those shown in FIG. 2 are denoted by the same numerical references. In the first embodiment shown in FIG. 2, the arithmetic operations unit 201 performs a prescribed operation, such as adding one (or incrementing), without external control. In contrast, in the second embodiment shown in FIG. 7, the arithmetic operations unit 201 can be controlled externally. To be more precise, the arithmetic operations unit 201 is adapted to perform a calculation using an externally supplied data item H (120C). Other than the arithmetic operation using the externally supplied data item H (120C), the storage device 100 has the same structure and performance as those illustrated in the first embodiment.

The calculation carried out on data C at the arithmetic operations unit 201 is not limited to a fixed operation (addition), but can be flexibly selected using an address input A, a data item C, a data item H (120C), combinations of these, or externally supplied instructions. Accordingly, the same data operation does not necessarily have to be performed in the entire address space of the address input A, and the operation scheme can be changed during the process.

In the example shown in FIG. 7, when a specific address input A or a specific data item H corresponding to the address input A is input to the storage device 100, the data C corresponding to that input address A may be invalidated. (This invalidation is different from the invalid data value stored in the data storage.) Because the input address A is already written in the compressed FIFO memory 102, it is difficult to delete this address information from the compressed FIFO memory 102, and therefore, information about the invalidation of the data item is given to the data storage 104. If the input address A that indicates the invalidated data item is read from the compressed FIFO memory 102 in the subsequent process, the invalidation information is output, together with the data item, from the storage device 100 to the processing apparatus 110. Alternatively, the invalidated data item may be discarded, without being supplied to the processing device 110, and the next data item may be read. This arrangement is effective when the processing device 110 is designed so as to cause error when a data item is output from the storage device 100 at unexpected timing. In other words, this arrangement can guarantee that the invalidated data item does not appear on the data path so as not to cause unnecessary error when a data item is output from the data storage 104.

Figure 8:
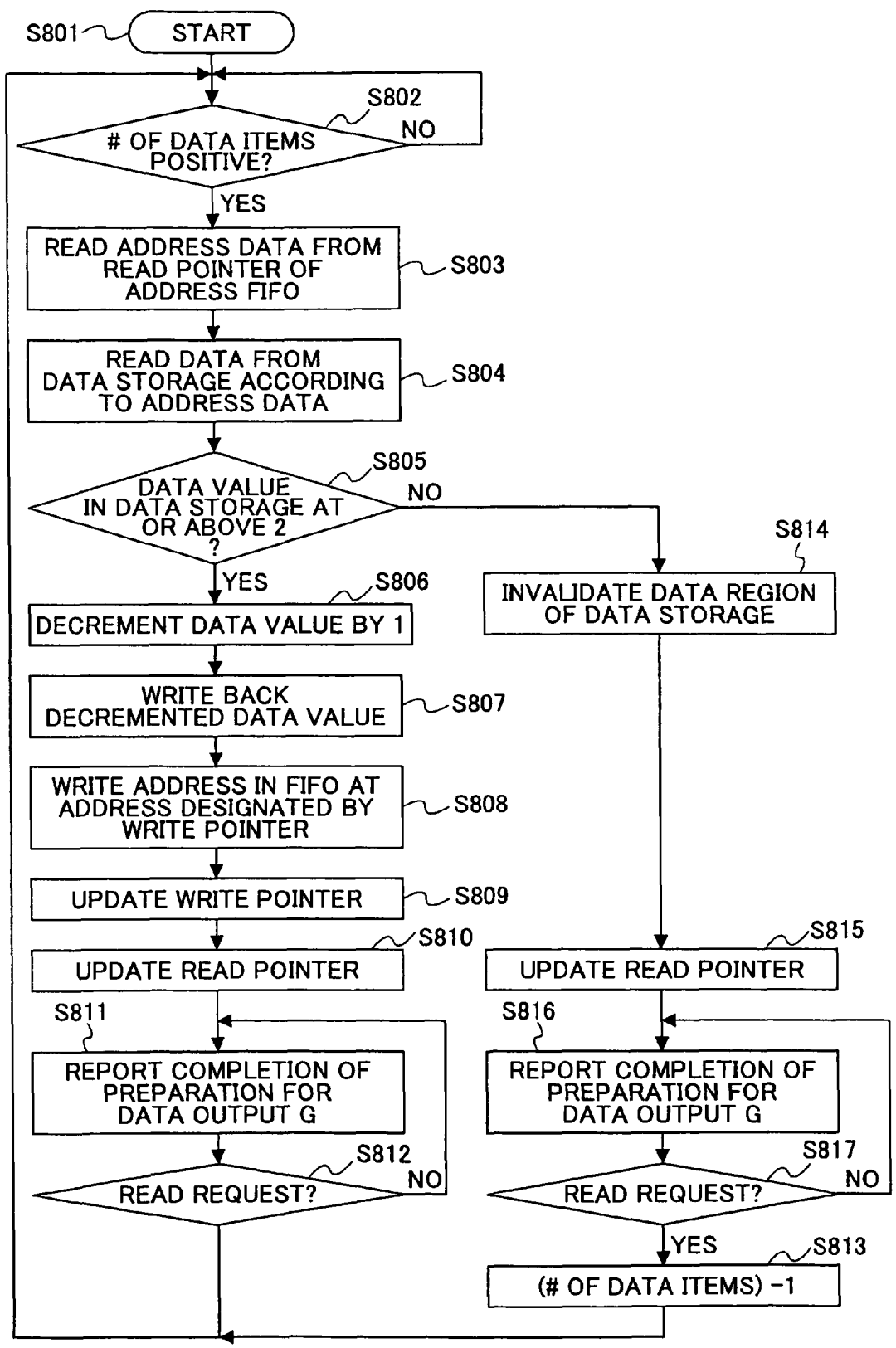
FIG. 8 is a flowchart showing the operations carried out by the output processing unit of the storage device according to the third embodiment of the invention.

If a data item is input to the data storage 104 at the same address as that of the invalidated data, the operation of the input processing unit 101 follows the flow performed when a valid data item is written in that address of the data storage 104. However, an arithmetic operation is not performed, and the input data item is written in the data storage 104 as it is. (The handling of the data item is the same as that carried out when a valid data item is not written in the data storage 104.) Next, the third embodiment of the present invention is explained. FIG. 8 is a flowchart showing the operation carried out by the output processing unit 105 of the storage device according to the third embodiment of the invention.

In the third embodiment, instead of outputting the data item G corresponding to the address F output from the compressed FIFO memory 102, the address value F is output as many times as that stored in the data storage 104, while decrementing the value stored in the data storage 104. This arrangement is effective when the processing device 110 is designed so as to process data items one by one even if multiple address inputs A are stored.

Steps S801 through S804 shown in FIG. 8 correspond to steps S601 through S604 shown in FIG. 6. Steps S814 through S817 correspond to steps S605 through S608 shown in FIG. 6. Steps S811 through S813 correspond to steps S607 through S609 shown in FIG. 6.

In the flowchart of FIG. 8, the process starts in step S801 in response to a read request input to the output processing unit 105 from a user.

Then, in step S802, it is determines whether the number of data items held in the FIFO memory 102 is positive. If the number of data items is positive, the process proceeds to step S803. If not, step S802 is repeated until the number of data items held in the FIFO memory 102 becomes positive.

In step S803, the current address is read from the read pointer of the compressed FIFO memory 102. Then, in step S804, the data item is read from the data storage 104 according to the address information read from the FIFO memory 102.

In step S805, it is determined whether the data value stored in the data storage 104 is greater than or equal to 2. If the data value is at or above 2 (YES in S805), the process proceeds to step S806. On the other hand, if not, the process jumps to step S814.

In step S806, the data value stored in the data storage 104 is decremented by one, and in step S807, the decremented data value is written back to the data storage 104.

In step S808, the address F is written in the compressed FIFO memory 102 at the address designated by the write pointer. In step S809, the write pointer of the compressed FIFO memory 102 is updated. Then, in step S810, the read pointer is updated.

Steps S811 through S813 are the same as step s S605 through S608 shown in FIG. 6. Namely, in step S811, a notice reporting the completion of preparation for data output G is supplied to the processing device 110 shown in FIG. 1. Then, in step S812, it is determined whether a read request has been received from the processing device 110. If a read request has been output from the processing device 110, the process returns to step S802. If the read request has not been received, the process returns to step S812 to wait for a read request.

If in step S805 the data value is less than 2 (NO in S805), the process jumps to step S814. Steps S814 through S817 are the same as steps S605 through S608 shown in FIG. 6. In step S814, the data region of the data storage 104 is invalidated.

Then, in step S815, the read pointer is updated. A notice reporting the completion of the preparation for the output data item is generated in step S816, and it is determined in step S817 whether there is a read request received. If there is a read request, the number of data items held in the FIFO memory 102 is decremented in step S813, and the process returns to step S802.

In the third embodiment, the write pointer has to be updated from both the input processing unit 101 and the output processing unit 105, so an exclusive operation is conducted so as to allow only one of the updating operations at a time. However, if a data value is written back to the data storage 104 (because of the data value of two or greater), the number of entries does not change, and the number of data items held in the data storage is the same.

Figure 9:
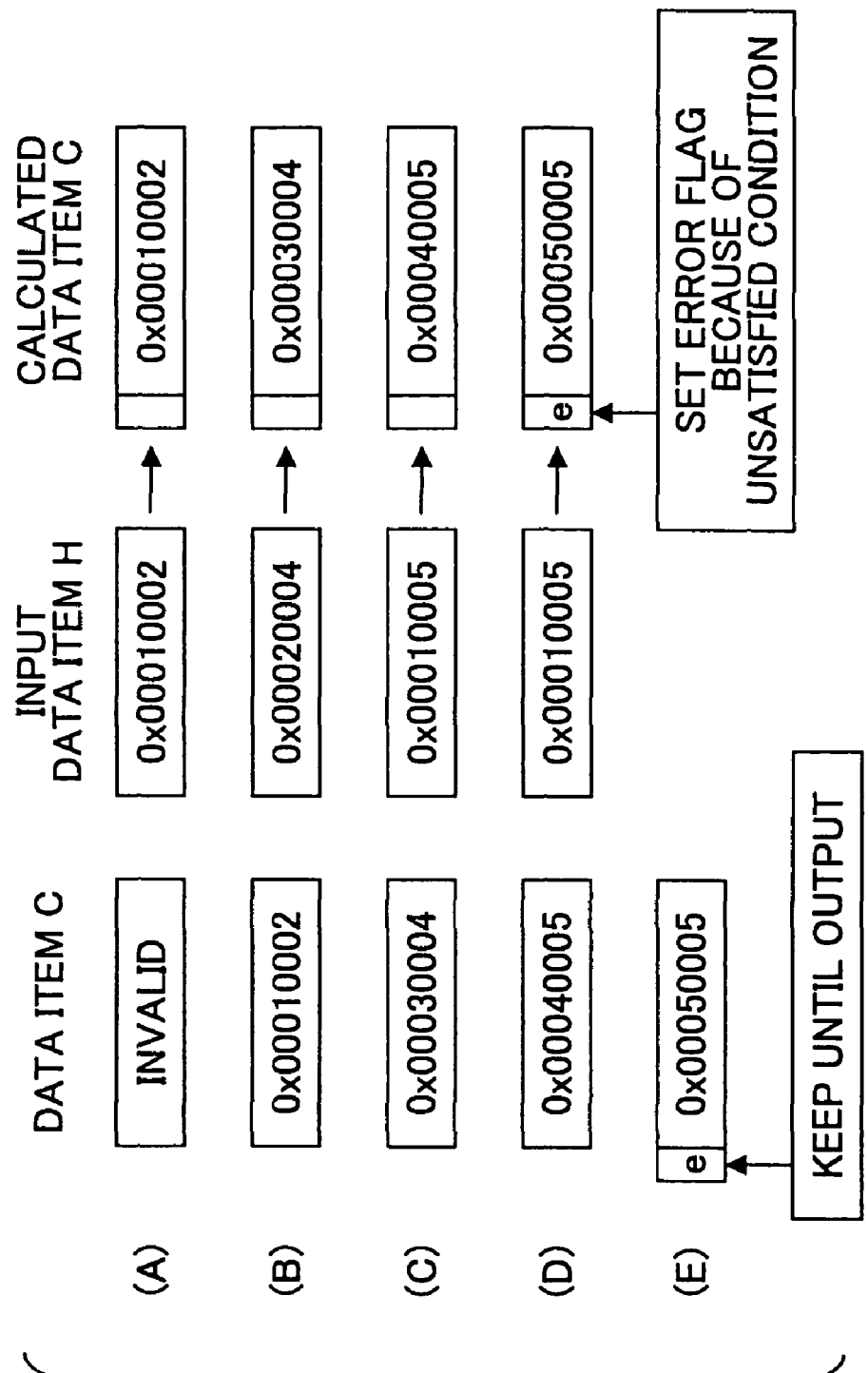
FIG. 9 is a schematic diagram used to explain the fourth embodiment of the invention.

Next, the fourth embodiment of the present invention is explained. FIG. 9 is a schematic diagram used to explain the fourth embodiment, which is carried out when the arithmetic operation result obtained in the second embodiment (FIG. 7) differs from the expected value.

For example, if the arithmetic result provided by the arithmetic operations unit 201 of the input processing unit 101 (FIG. 7) does not agree with a value expected from the data item C, the externally supplied data input H (120C), the address input A, or the combinations of these items, error information can be held in the flag region 204 of the data storage 104. In this case, the arithmetic result is stored as it is in the data region 203 of the data storage 104. Even if the arithmetic result deviates from the expected value, it may possibly return to the expected value through the subsequent operations. For this reason, the error information and the arithmetic result are held in the data storage 104. The error information can be utilized in pattern detection for checking the expectation that the data value will not exceed a certain value or checking for the presence of data input.

The error information stored in the flag region 204 is supplied to the processing device 110 as a part of the data item or separately from the data item when the data item is output from the storage device 100.

FIG. 9 illustrates the example of the above-described process for dealing with the error information. It is assumed that a certain relation expressed by equation (1) is expected between the data item H corresponding to an input address and the data item C held in the data storage 104.

$$\text{Data } C[15:0] + \text{Data } H[31:16] = \text{Data } H[15:0] \qquad (1)$$

Then, the new data item C to be held is expressed as follows:

$$\text{New Data } C[31:16] = \text{Data } C[31:16] + \text{Data } H[31:16] \qquad (2)$$

$$\text{New Data } C[15:0] = \text{Data } H[15:0] \qquad (3)$$

If the data C is invalid, the check is not performed, and the data C is treated as being 0x00000000. The symbol [31:16] indicates that the data item corresponds to the $31^{st}$ bit through the $16^{th}$ bit in a 32-bit data item (consisting of bit 0 to bit 31), wherein bit 0 is the least significant bit (LSB).

In the example shown in FIG. 9, cases (A) through (C) satisfy the above-described relations. However, case (D) does not satisfy equation (1). Consequently, error information "e" is set in the flag region 204 of the data storage 104. This error information is read, together with the data item, from the data storage 104, in order to report the occurrence of data error to the processing device 110 and prevent the processing device 110 from performing wrong operation.

If unrecoverable hardware error occurs during the read operation from the data storage 104, the error information can also be stored in the data storage 104. An arithmetic operation itself is carried out on the data item which is supposed to be wrong, and the arithmetic result is stored in the data storage 104. Once the hardware error has occurred, the error information is continuously held. Such error information can be utilized to prevent the influence of the hardware error from expanding. When a hardware error occurs, the error may be reported through another route in order to fix the error within the range using the input address A. The hardware error information is also supplied as a part of or separately from the data item when the data item is output from the data storage 104 to the processing device 110.

Figure 10:
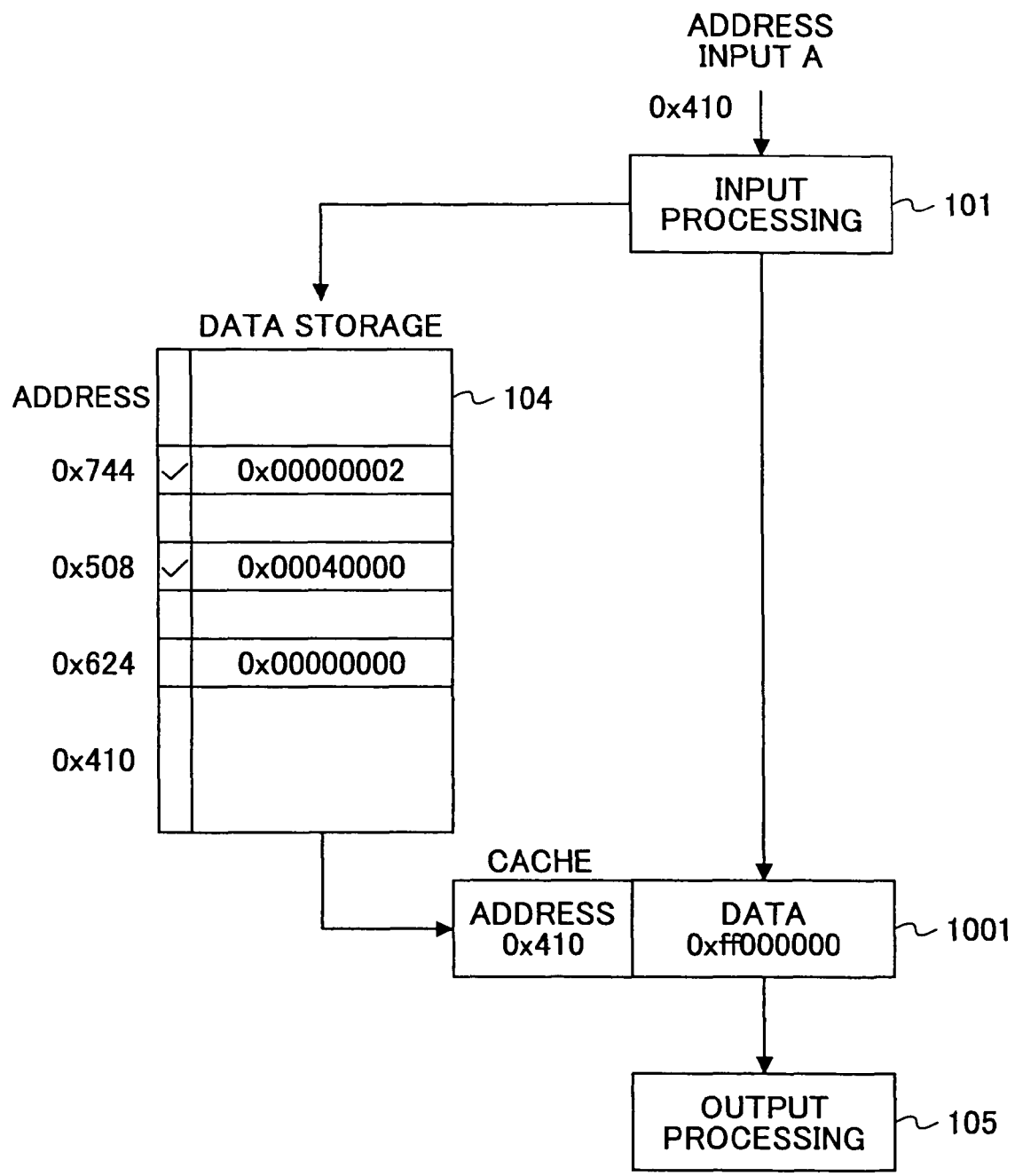
FIG. 10 is a schematic diagram used to explain the fifth embodiment of the invention.

Next, the fifth embodiment of the present invention is explained. FIG. 10 is a schematic diagram used to explain the fifth embodiment. The storage device of the fifth embodiment has a cache memory 1001 connected to the input processing unit 101, the output processing unit 105, and the data storage 104. The outputs from the data storage 104 and the input processing unit 101 are connected to the inputs of the cache memory 1001. The output of the cache memory 1001 is connected to the input to the output processing unit 105.

A memory with large access latency is often used to store, for example, data of a broad range of address spaces. In this case, it is desirable for those data items at addresses expected to be frequently used to be stored in a high-speed memory. Alternatively, it is preferable for the first several inputs of address data to be stored in the cache memory 1001 (which is a high-speed memory), instead if being written in the data storage 104. Upon occurrence of the next address input, it is determined which one of the data storage 104 or the cache memory 1001 is holding the address, to increment the data value. Based on the determination result, the newly coming address data are stored in the appropriate memory by the input processing unit 101. This arrangement can hide the access latency in the storage device.

What is claimed is:

1. A storage device for storing data while compressing same value input data, comprising:
    an input processing unit;
    a data storage;
    a first-in-first-out memory having a read pointer and a write pointer operating independently of each other; and
    an output processing unit;
    wherein:
    the input processing unit, upon receiving an input value, determines whether a data value stored in the data storage at an address location corresponding to the input value is valid, and:
    if the data value is invalid, the input processing unit stores an initial value at the address location of the data storage and stores the input value in the first-in-first-out memory using the write pointer, and
    if the data value is valid, the input processing unit performs an arithmetic operation on the data value and stores the operation result in the address location of the data storage corresponding to the input value without storing the input value in the first-in-first-out memory;
    the output processing unit reads and outputs the input value stored at a head of the first-in-first-out memory using the read pointer, as well as reads and outputs the data value from the address location of the data storage corresponding to the input value, if one or more input values are stored in the first-in-first-out memory and if the data value stored at the address location of the data storage corresponding to the input value is valid, and to update the data value after the output; and
    wherein the output operation from and the input operation in the first-in-first-out memory are performable simultaneously using the read pointer and the write pointer.

2. The storage device of claim 1, wherein the input processing unit is configured to increment the data value by 1 for the arithmetic operation when the data value is valid.

3. The storage device of claim 1, wherein the input processing unit determines the arithmetic operation to be performed based on at least one of the data value, the input value, and a combination of these two.

4. The storage device of claim 1, wherein the input processing unit holds an externally supplied arithmetic value, performs the arithmetic operation on the data value if the data value is valid, and writes back the operation result to the address location, without storing the input value in the first-in-first-out memory.

5. The storage device of claim 4, wherein the input processing unit is configured to add the arithmetic value to the data value stored in the data storage at the address location corresponding to the input value.

6. The storage device of claim 4, wherein the input processing unit is configured to determine the arithmetic operation based on at least one of the data value, the input value, the arithmetic value, and combinations thereof.

7. The storage device of claim 4, wherein the arithmetic operation performed by the input processing unit is set externally.

8. The storage device of claim 1, wherein the output processing unit updates the data value after the output by decrementing the data value by 1 and writing back the decremented data value to said address location.

9. The storage device of claim 8, wherein if the decremented data value becomes the invalid value, the output processing unit writes the invalid value in said address location.

10. The storage device of claim 1, wherein a flag indicating validity of the data value is set in the data storage, and the input processing unit examines the validity of the data value with reference to the flag.

11. The storage device of claim 1, wherein if the operation result satisfies a prescribed condition, a flag is set in the data storage in association with the stored operation result, and the output processing unit outputs the data value, together with the flag.

12. The storage device of claim 1, wherein a specific input value is received, the input processing unit invalidates the data value to be stored at the address corresponding to the specific input value and adds invalidation information to the invalidated data value, and the output processing unit outputs the invalidated data value, together with invalidation information, when the specific input value is read.

13. The storage device of claim 1, wherein if an unrecoverable hardware error has occurred during a read operation, the data storage stores error information, together with the arithmetic operation result performed on the data value under the error condition, and the output processing unit outputs the error information as a part of or separately from the arithmetic operation result.

14. The storage device of claim 1, wherein the data storage includes a plurality of data storages with different response characteristics.

* * * * *